(12) United States Patent
Chiu

(10) Patent No.: US 6,585,024 B1
(45) Date of Patent: Jul. 1, 2003

(54) POSITIONING TARGET FOR LAMINATED PRINTED CIRCUIT BOARD

(75) Inventor: Hsien-Yu Chiu, Taoyuan Hsien (TW)

(73) Assignee: Compeq Manufacturing Company Limited, Taoyuan Hsien (TW)

(*) Notice: Subject to any disclaimer, the term of this patent is extended or adjusted under 35 U.S.C. 154(b) by 23 days.

(21) Appl. No.: 10/046,253

(22) Filed: Jan. 16, 2002

(51) Int. Cl.⁷ .............................................. B30B 15/00
(52) U.S. Cl. ......................... 156/580; 29/467; 29/848; 269/903
(58) Field of Search ................... 156/580, 581, 156/583.1; 29/464, 467, 848; 269/903

(56) References Cited

U.S. PATENT DOCUMENTS

| | | | | |
|---|---|---|---|---|
| 4,666,551 A | * | 5/1987 | Soberay et al. | 156/382 |
| 5,182,121 A | * | 1/1993 | Miyashita et al. | 425/338 |
| 5,496,433 A | * | 3/1996 | Miyashita et al. | 156/358 |
| 5,772,815 A | * | 6/1998 | Jordan et al. | 156/64 |
| 5,892,203 A | * | 4/1999 | Jordan et al. | 219/393 |

* cited by examiner

Primary Examiner—James Sells
(74) Attorney, Agent, or Firm—Bacon & Thomas PLLC

(57) ABSTRACT

A positioning target for a printed circuit board made of base layers and by at least two pressing processes has a first width, a second width formed in the first width, a left margin and a right margin formed on opposite sides of the second width and immediately adjacent to the second width, a first length, a second length formed in the first length, a top margin and a bottom margin. An area formed by a mix of the second width and the second length is for the laminated printed circuit board and multiple positioning holes are respectively defined in two adjacent margins horizontally respective to end sides of two adjacent margins.

3 Claims, 4 Drawing Sheets

POSITIONING TARGET FOR LAMINATED PRINTED CIRCUIT BOARD

BACKGROUND OF THE INVENTION

1. Field of the Invention

The present invention relates to a positioning target for a laminated printed circuit board, and more particularly to a positioning target used in a printed circuit board having at least two pressing.processes in manufacturing the printed circuit board.

2. Description of Related Art

A printed circuit board is composed of at least two base layers pressed together. When these at least two base layers are pressed, because there is glue applied among a nucleation surface of each of the at least two base layers, the at least two base layers might easily slip away from the proper pressing location, which leads a mis-alignment among the at least two base layers. Furthermore, because each of the at least two base layers has metal wires printed thereon, when mis-alignment occurs among the at least two base layers, there will be no electrical conduction between wires of the at least two adjacent base layers. Therefore, it is important to have perfect alignment among base layers in the pressing process while making the printed circuit board.

With reference to FIG. 4, a conventional positioning target board (60) for a laminated printed circuit board having at least two pressing processes has multiple positioning points, i.e., P1, P2, P3, P4, P5, P6, P7, P8, P9, P10. The positioning target board (60) is used to position the base layers when in a process of manufacturing a laminated printed circuit board. The positioning points P1, P2, P3, P4, P5, P6, P7, P8, P9, P10 listed on the positioning target board (60) are for illustrative purposes only and not limited to the manner shown.

The positioning target board (60) is used to position two base layers when pressed together. That is, when two base layers are to be pressed together, the two base layers are first applied with glue on a nucleation surface of each of the base layers. After the glue is applied, the two base layers are aligned with the positioning target board (60) and positioning means such as rivets, pins or the like are used to extend through P1, P2, P4 and P5 respectively (and possibly also P3 and P8) and the two base layers so as to correctly align and position the two base layers. The reason P3 and P8 are not necessarily required to have a positioning means is that the purpose of having P3 is to ensure that the positioning target board (60) has only one orientation to match a tool used to press the two base layers together. After the two base layers are perfectly pressed together, a part of the glue applied on the nucleation surfaces of each of the base layers will be forced to flow out of edges of the combined base layers. To remove the edges with glues from the combined base layers, the user will have to cut off edges containing the P1 and P2, and P4 and P5. When another base layer is to be pressed together with the combined base layers, positioning means is again used to extend through P6, P7 and P9, P10 and the base layers so as to position all the base layers. Then, the tool is applied to press the base layers together, which also results in the outflow of the glue applied on nucleation surfaces between two adjacent base layers. Again, the user will have to cut off edges containing P6, P7, P9 and P10 to complete the manufacture of the laminated printed circuit board. In order to have the laminated printed circuit board have a clear cut, the distance between every cut should be at least one inch (2.54 cm). That is, a distance required in the edges of the positioning target board (60) during the entire process in manufacturing the laminated printed circuit board depends on a cut quantity. For example, when the cut quantity increases, e.g., four, five or even six times are required, the distance on the edges of the positioning target board (60) and to be cut in the manufacturing process increases.

The vertical arrangement of the positioning points P1, P2, P3, P4, P5, P6, P7, P8, P9, P10 with respect to each end side of the positioning target board (60) leads to a waste in material of the positioning target board (60) and thus a reusing rate for the positioning target board (60) is therefore reduced.

To overcome the shortcomings, the present invention tends to provide an improved positioning target board structure to mitigate and obviate the aforementioned problems.

SUMMARY OF THE INVENTION

The primary objective of the present invention is to provide a positioning target board for manufacturing the printed circuit board, wherein the positioning target board has multiple positioning points each defined along a length of each end side of the positioning target board. With this arrangement, the user only needs to cut a small portion on the end edge with an overflow of the glue. Therefore, material and cost are saved.

Other objects, advantages and novel features of the invention will become more apparent from the following detailed description when taken in conjunction with the accompanying drawings.

DETAILED DESCRIPTION OF THE PREFERRED EMBODIMENT

Figure 1:
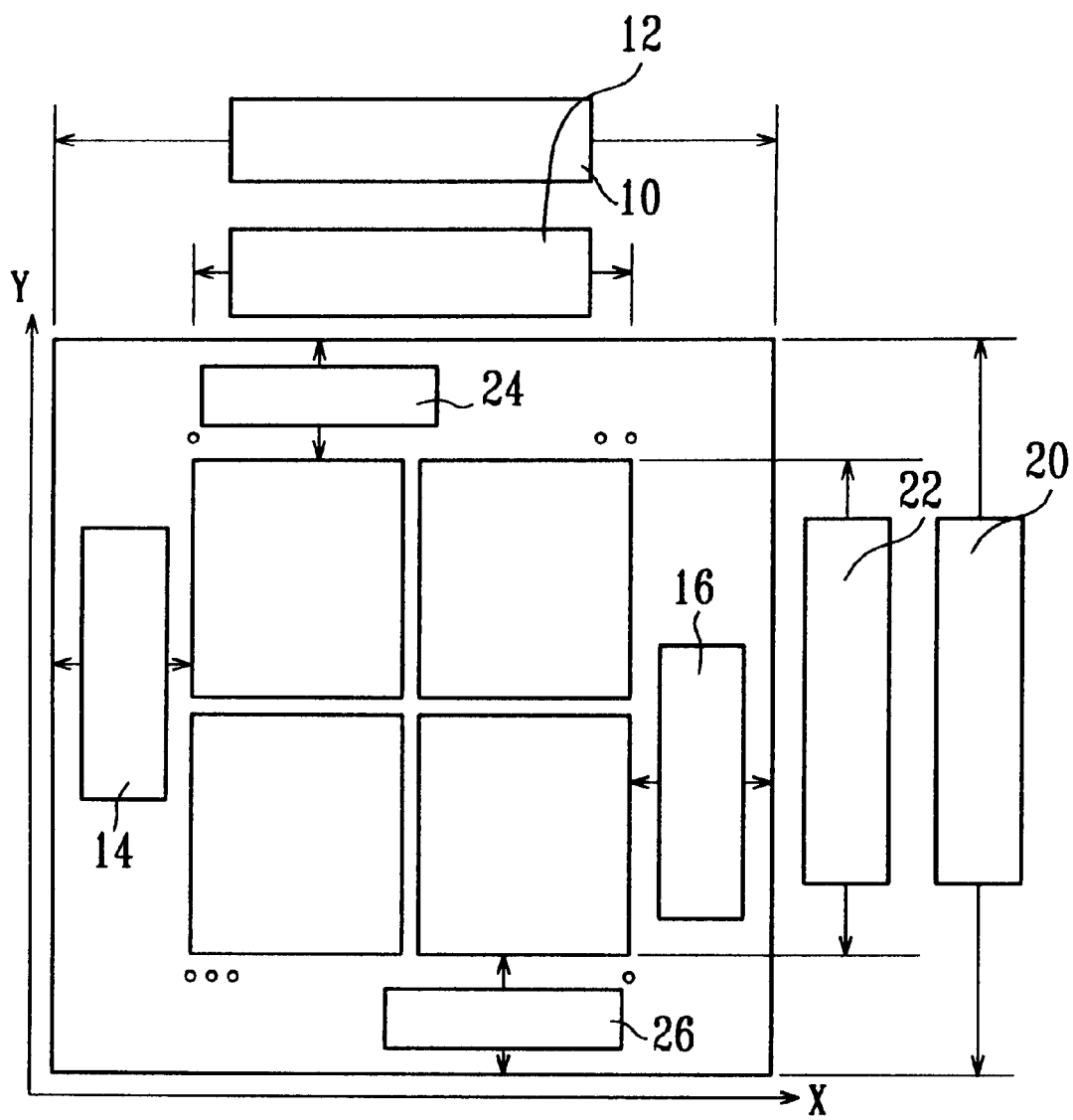
FIG. 1 is a schematic view of a printed circuit board showing definitions of each part on the printed circuit board.

With reference to FIG. 1, a substrate for making a printed circuit board normally has two orientations, one is the X orientation and the other one is the Y orientation. In the X orientation, there is defined a first width (10), a second width (12) formed in the first width (10), a left margin (14) and a right margin (16). In the Y orientation, there is defined a first length (20), a second length (22) formed in the first length (20), a top margin (24) and a bottom margin (26). It is noted that the printed circuit board is formed in an area enclosed by the second width (12) and the second length (22). Accordingly, areas other than that enclosed by the second width (12) and the second length (22) need to be removed when making the printed circuit board.

Figure 2:
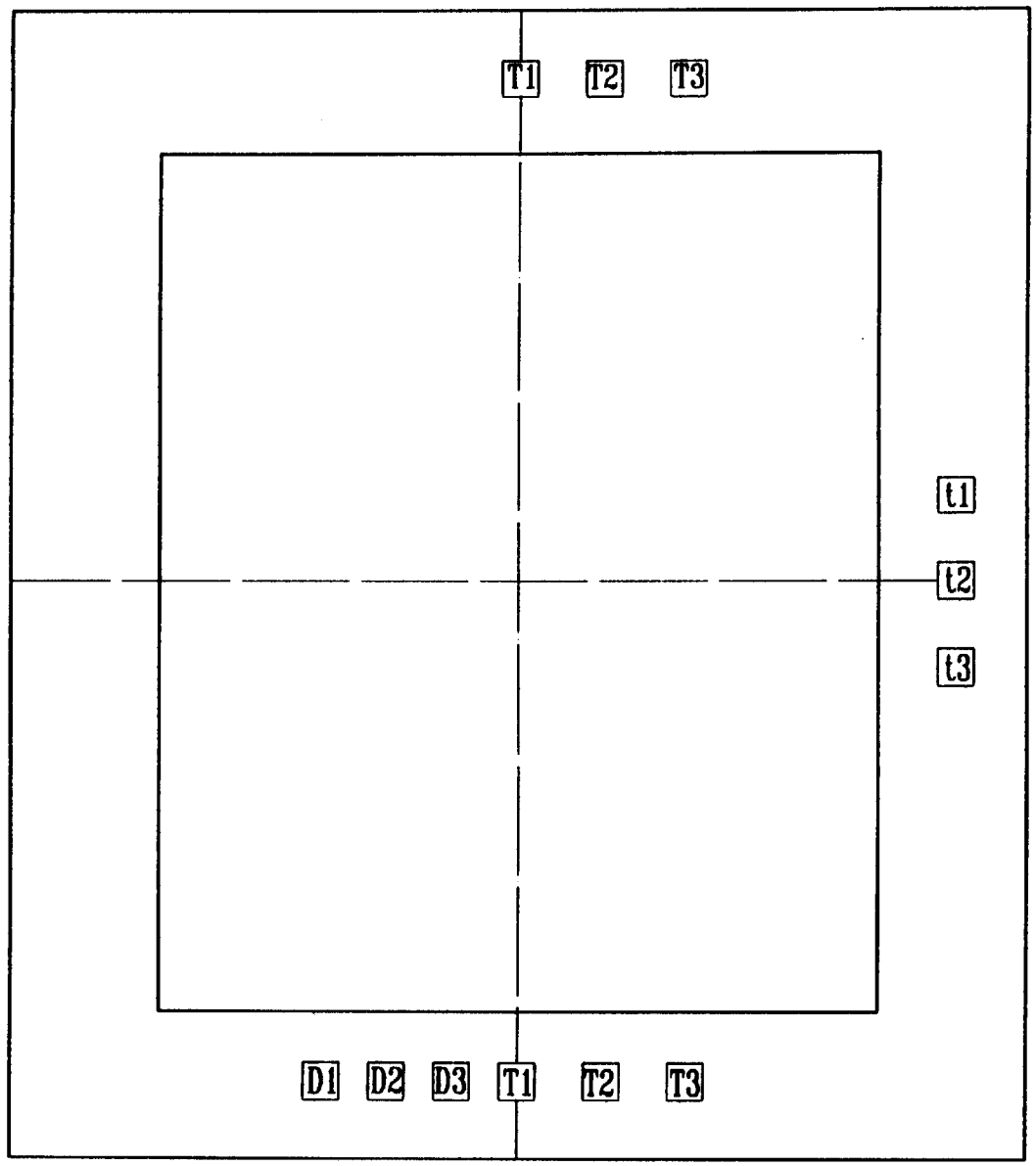
FIG. 2 is a plan view showing the arrangement of the positioning points defined in the positioning target board of the present invention.

With reference to FIG. 2 and still taking FIG. 1 for reference, a plurality of positioning holes (T1, T2, T3) (t1, t2, t3) are defined in areas not enclosed by the second width (12) and the second length (22). That is, the positioning holes (T1, T2, T3) (t1, t2, t3) are defined in the left, right, top and bottom margins (14,16,24,26). It is noted that the positioning holes (T1, T2, T3) are horizontal to one end side of the substrate and the positioning holes (t1, t2, t3) are horizontal to another end side of the substrate. There is no superimposition situation in any of the positioning holes (T1, T2, T3) (t1, t2, t3). Thus, the positioning holes (T1, T2, T3) (t1, t2, t3) are horizontally arranged on the substrate for making the laminated printed circuit board.

Taking the embodiment shown in FIG. 2 for reference, the quantity of the positioning holes (T1, T2, T3) in this embodiment implies that the laminated printed circuit board requires three (3) different pressing processes. When the first pressing is processed, the positioning location is determined at positioning hole (T3), which is one (1) inch away from a center of the substrate. When the second pressing is processed, the positioning location is determined at positioning hole (T2) which is 0.5 inch away from the center of the substrate. Finally, when the final pressing process is initiated, the positioning location is the center line of the substrate.

Therefore, every time there is a pressing process initiated, only a 0.5 inch is required to make another pressing process. Moreover, after a pressing process is finished, a cut is necessary to be applied to the end sides of the substrate so as to remove the end side with the overflow of the glue between the nucleation surfaces between two adjacent base layers. Because only a 0.5 inch wide strip is required for each pressing process, there is a 0.2 inch clearance available for the user to cut the end sides with the glue overflow.

Figure 3:
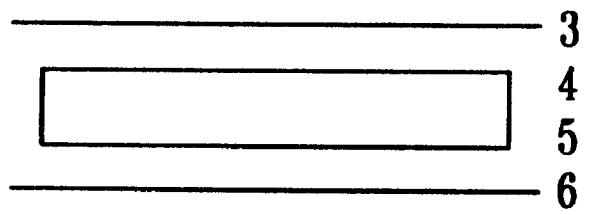
FIG. 3 is an embodiment of the present invention, wherein a laminated printed circuit board having eight (8) base layers is implemented for explanation of three pressing processes required to make the laminated printed circuit board.
Figure 3:
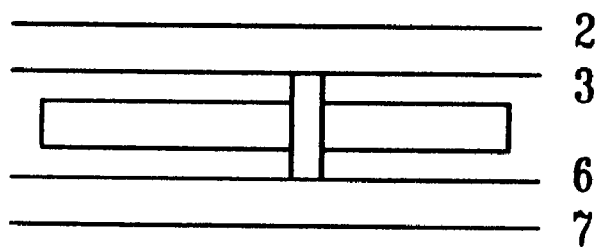
Figure 3:
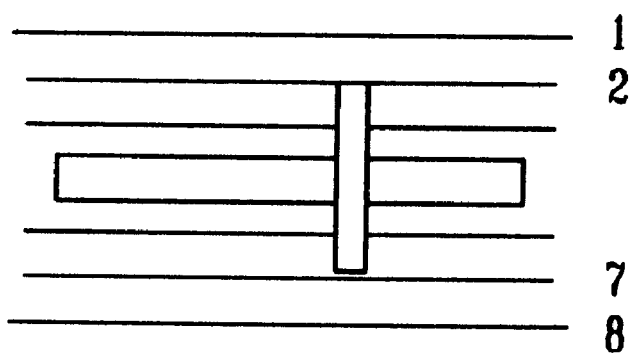
Figure 4:
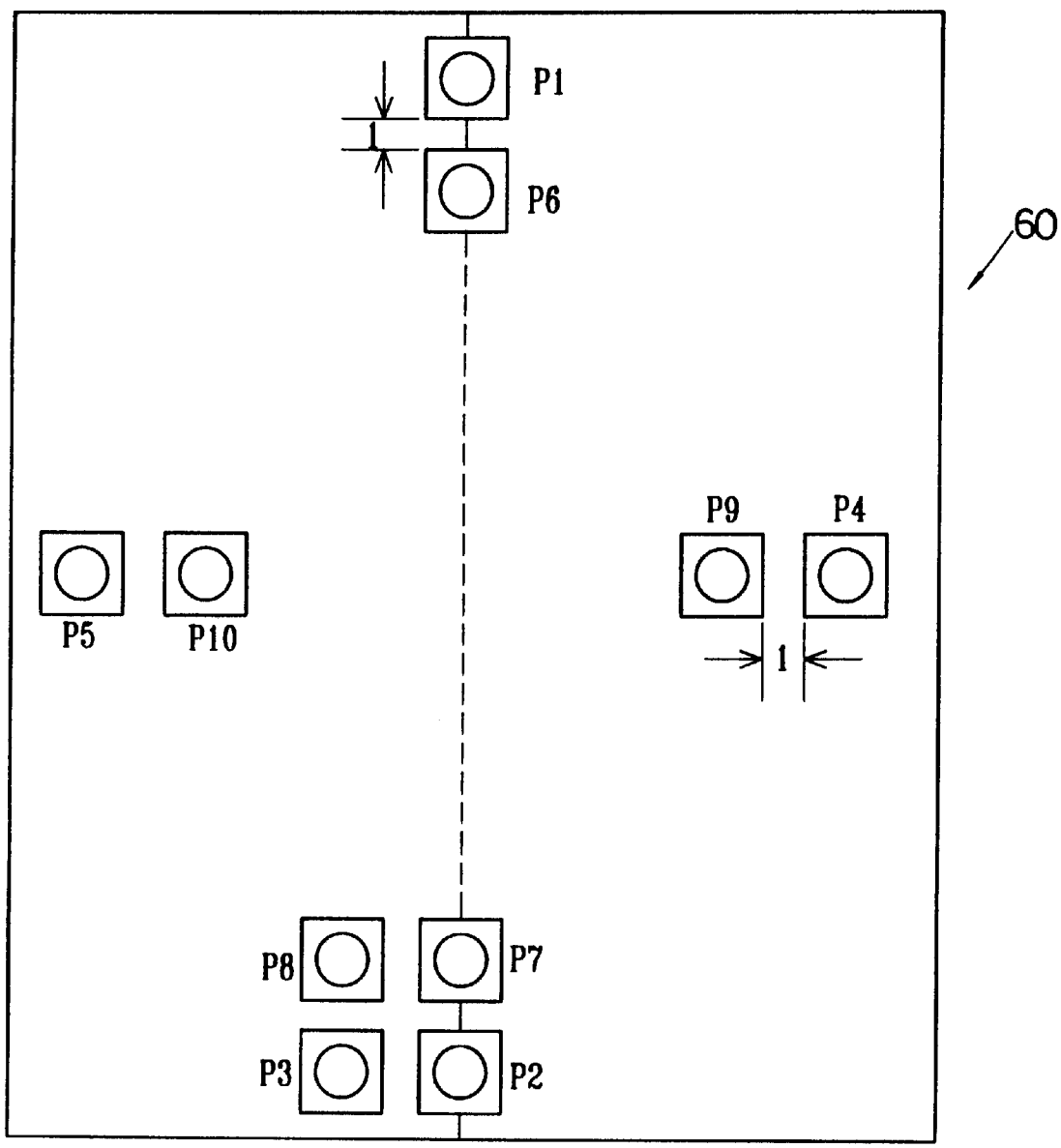
FIG. 4 is a top plan view showing a conventional positioning target board.

With reference to FIG. 3, taking a laminated printed circuit board with eight (8) different base layers for instance, the first pressing process compresses the third, fourth, fifth and sixth base layers together. Thereafter, the second and the seventh base layers are pressed on the combined third, fourth, fifth and sixth base layers. Finally, the first and eighth base layers are pressed on the combined, second, third, fourth, fifth, sixth and seventh base layers. Only a 0.2 inch wide strip is required in each pressing process to remove the end sides with the glue overflow. Therefore, a total of 0.6 inch in strips is required to remove the glue overflow, which is a great improvement in material saving when compared to the conventional method that consumes a total of one inch in strips in a single pressing process.

It is concluded that having the positioning holes defined in horizontal with respect to end sides of the substrate for making laminated printed circuit board saves and therefore increases the reuse rate of the material.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A positioning target for a printed circuit board made of base layers and by at least two pressing processes, the positioning target comprising:

a first width, a second width formed in the first width, a left margin and a right margin formed on opposite sides of the second width and immediately adjacent to the second width;

a first length, a second length formed in the first length, a top margin and a bottom margin;

wherein an area formed by a mix of the second width and the second length is for the laminated printed circuit board and multiple positioning holes are respectively defined in two adjacent margins horizontally respective to end sides of two adjacent margins.

2. The positioning target as claimed in claim 1, wherein a dimension of the top, bottom, left and right margins depends on a quantity of cuts to remove a glue overflow in two nucleation surfaces of two base layers for making the laminated printed circuit board.

3. The positioning target as claimed in claim 2, wherein a margin of 0.2 inch is required in each of the pressing processes to remove the glue outflow between two nucleation surfaces of two base layers.

* * * * *